(12) United States Patent
Bogdanov et al.

(10) Patent No.: US 6,737,247 B2
(45) Date of Patent: May 18, 2004

(54) IMAGING OF ENZYMATIC ACTIVITY

(75) Inventors: Alexei Bogdanov, Arlington, MA (US); Ralph Weissleder, Charlestown, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 09/999,665

(22) Filed: Oct. 19, 2001

(65) Prior Publication Data

US 2002/0127629 A1 Sep. 12, 2002

Related U.S. Application Data

(60) Provisional application No. 60/241,566, filed on Oct. 19, 2000, and provisional application No. 60/310,335, filed on Aug. 6, 2001.

(51) Int. Cl.$^7$ .............................. C12Q 1/26; C12Q 1/48; C12Q 1/34; C12Q 1/44; C12Q 1/32; C12Q 1/30; C12Q 1/28

(52) U.S. Cl. .............................. 435/25; 435/15; 435/18; 435/19; 435/26; 435/27; 435/28

(58) Field of Search .............................. 435/15, 25, 26, 435/27, 28, 18, 19

(56) References Cited

U.S. PATENT DOCUMENTS

| | | | |
|---|---|---|---|
| 5,254,460 A | | 10/1993 | Josephson et al. |
| 5,446,145 A | * | 8/1995 | Love et al. .................. 540/465 |
| 5,482,700 A | | 1/1996 | Deutsch et al. |
| 5,707,605 A | * | 1/1998 | Meade et al. ............... 424/9.35 |
| 5,817,774 A | | 10/1998 | Delecki et al. ................ 534/10 |
| 5,980,862 A | | 11/1999 | Meade et al. |

FOREIGN PATENT DOCUMENTS

WO    WO 9847539 A1 * 10/1998    .......... A61K/49/00

OTHER PUBLICATIONS

Li et al., "Mechanistic Studies of a Calcium–Dependent MRI Contrast Agent" (2002) Inorg. Chem., 41, 4018–4024.*
Duarte et al., " Synthesis, Characterization, and Relaxivity of Two Linear Gd(DTPA)–Polymer Conjugates" (2001) Bioconjugate Chem., 12, 170–177.*
Moats et al., "A 'Smart' Magnetic Resonance Imaging Agent that Reports on Specific Enzymatic Activities" (Apr., 1997) Angew. Chem. Int. Ed., 36(7), 726–728.*
Bogdanov, A., "The Development of in vivo Imaging Systems to Study Gene Expression" (1998) Trends in Biotechnology, 16(1), 5–10.*
Bell et al., "Assessing Gene Expression in vivo: Magnetic Resonance Imaging and Spectroscopy" (Aug., 2000) Gene Therapy, 7(15), 1259–1264.*
Nivorozhkin et al., "Enzyme–Activated Gd3+ Magnetic Resonance Imaging Contrast Agents with a Prominent Receptor–Induced Magnetization Enhancement" (Aug., 2001) Angew. Chem. Int. Ed., 40(15), 2903–2906.*
Stanisz et al., "Gd–DTPA Relaxivity Depends on Macromolecular Content" (2000) Magnetic Resonance Med. 44, 665–667.*
Richard A. Gross et al., "Polymer Synthesis by In Vitro Enzyme Catalysis", *Chem. Rev.*, vol. 101, No. 7, pp. 2097–2124 (2001).
Akkara et al., Biomimetic Membrane and Interface Templates for Enzyme–Based Polymerization Reactions, Biomimetics, vol. 2, No. 4, 1994, pp. 331–339.
Louie et al., In vivo visualization of gene expression using magnetic resonance imaging, Nature Biotechnology vol. 18, Mar. 2000, pp. 321–325.

* cited by examiner

*Primary Examiner*—Jon P. Weber
(74) *Attorney, Agent, or Firm*—Fish & Richardson P.C.

(57) ABSTRACT

The invention features methods of detecting enzymatic activity (e.g., in a magnetic resonance image). In general, the methods include: (1) providing a monomeric substrate (e.g., a substrate that is polymerizable in the presence of an enzyme or as a result of an enzyme-catalyzed reaction), having the generic structure X-Y-Z, where X includes a chelator moiety having a chelated paramagnetic or superparamagnetic metal atom or ion, Y includes a linker moiety (e.g., to provide a covalent or non-covalent chemical bond or bonds between X and Z), and Z includes a polymerizing moiety; (2) contacting the substrate with a target tissue, wherein the substrate undergoes polymerization to form a paramagnetic or superparamagnetic polymer, the polymerization being catalyzed by an enzyme in an extracellular matrix or bound to the surfaces of cells of the target tissue; and (3) detecting an increase in relaxivity for the polymer relative to an equivalent amount of unpolymerized substrate. The invention also features substrate compositions.

27 Claims, 4 Drawing Sheets

IMAGING OF ENZYMATIC ACTIVITY

CROSS-REFERENCE TO RELATED APPLICATIONS

This application claims the benefit of U.S. Provisional Application No. 60/241,566, filed Oct. 19, 2000, and U.S. Provisional Application No. 60/310,335, filed Aug. 6, 2001, both of which are incorporated herein by reference in their entirety.

FIELD OF THE INVENTION

This invention relates to biochemistry and magnetic resonance imaging.

BACKGROUND OF THE INVENTION

Non-invasive imaging of molecular expression in vivo with high resolution and high sensitivity would be a useful tool in clinical diagnostics and in biomedical research. A detectable label, e.g., a radioactive atom, can be linked to a targeting moiety, e.g., an antibody, which binds specifically a molecular target (molecule of interest). Such targeting can be used for imaging cells or tissues that display the molecular target. Magnetic resonance imaging (MRI) offers certain well-known advantages as a non-invasive imaging technology. For example, MRI can potentially provide exceptionally high anatomic resolution approaching single-cell levels (voxel of 20–40 $\mu m^3$). Moreover, recent innovations in instrument design and contrast agent development indicate that above level of resolution can be achieved non-invasively in vivo. One of the major future directions of in vivo MRI research includes mapping of specific molecules (e.g. receptors) and detecting patterns of their expression.

However, the inherently low sensitivity of MRI to the presence of magnetic labels, and consequently low signal-to-background ratio, has limited the usefulness of MRI for detection and imaging of low-abundance, molecular targets such as cell surface receptor molecules. MRI of receptor-specific contrast agents has been challenging because of relatively low sensitivity to the presence of paramagnetic metal labels. For example, the detectability limit for paramagnetic gadolinium complexes is estimated to be approximately 100 $\mu$mol Gd per gram of tissue. Therefore, a way of amplifying an MRI signal from a targeted, magnetic label is needed.

A number of different amplification schemes have been pursued to increase specific MR signal. Most commonly, amplification is achieved by covalent attachment of several signal-generating paramagnetic cations or a superparamagnetic particle to a targeting molecule (e.g., a receptor ligand). However, affinity molecules that are not bound to the target (circulating in the bloodstream or retained non-specifically) can generate high background signal due to indiscriminate shortening of water proton relaxation times. Nonspecific signal can obscure the target due to the low target/background ratio. This is especially relevant in the case of vascular targeting.

SUMMARY OF THE INVENTION

The invention is based on the discovery that enzyme activity can be used to amplify the decrease in local proton relaxation rates produced by chelated gadolinium (Gd) or other metals. This amplification has been demonstrated to result from enzyme-dependent polymerization of a monomeric substrate in which the metal atom or ion is chelated.

Based on this development, the invention features methods of detecting enzymatic activity (e.g., in a magnetic resonance image). In general, the methods include: (1) providing a monomeric substrate (e.g., a substrate that is polymerizable in the presence of an enzyme or as a result of an enzyme-catalyzed reaction), having the generic structure X-Y-Z, where X includes a chelator moiety having a chelated paramagnetic or superparamagnetic metal atom or ion, Y includes a linker moiety (e.g., to provide a covalent or non-covalent chemical bond or bonds between X and Z), and Z includes a polymerizing moiety; (2) contacting the substrate with a target tissue, wherein the substrate undergoes polymerization to form a paramagnetic or superparamagnetic polymer, the polymerization being catalyzed by an enzyme in an extracellular matrix or bound to the surfaces of cells of the target tissue; and (3) detecting an increase in relaxivity for the polymer relative to an equivalent amount of unpolymerized substrate.

As used herein, "an equivalent amount of unpolymerized substrate" means the number of monomeric substrate molecules represented by a polymer having a particular molecular size or mass.

Examples of chelating moieties that can be incorporated into a monomeric substrate for use in the invention include the following: 1,4,7,10-tetraazacyclododecane-N,N',N'',N'''-tetraacetic acid (DOTA); 1,4,7,10-tetraaza-cyclododecane-N,N',N''-triacetic acid; 1,4,7-tris(carboxymethyl)-10-(2'-hydroxypropyl)-1,4,7,10-tetraazocyclodecane, 1,4,7-triazacyclonane-N,N',N''-triacetic acid; and 1,4,8,11-tetraazacyclotetra-decane-N,N',N'',N'''-tetraacetic acid; diethylenetriamine-pentaacetic acid (DTPA); triethylenetetraamine-hexaacetic acid; ethylenediamine-tetraacetic acid (EDTA); EGTA; 1,2-diaminocyclohexane-N,N,N',N'-tetraacetic acid; N-(hydroxyethyl) ethylenediaminetriacetic acid; nitrilotriacetic acid; and ethylene-bis(oxyethylene-nitrilo)tetraacetic acid.

The paramagnetic or superparamagnetic metal atom or ion can be, for example, a transition metal or lanthanide atom or ion having paramagnetic properties (e.g., $Fe^{3+}$, $Gd^{3+}$, $Dy^{3+}$, $Eu^{3+}$, $Mn^{2+}$).

Examples of suitable linker moieties include: amino acids, oligopeptides (e.g., oligopeptides having 2–6 amino acid residues), nucleotides, an oligonucleotides (e.g., oligonucleotides having 2–6 nucleotide residues), $C_3$–$C_{12}$ alkyl groups, polyethyleneimines, saccharides, oligosaccharides, medium chain fatty acids, polyamidoamines, polyacrylic acids, and polyalcohols. In some embodiments of the invention, the linker moiety can contain an amino acid or oligopeptide containing 2–6 amino acid residues. Thus, in certain embodiment of the invention, the monomeric substrate can have the structure:

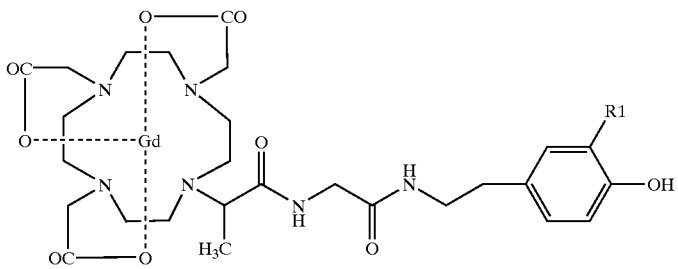

where $R^1$ is H, OH, or $OCH_3$.

As used herein, a "polymerizing moiety" can be any chemical group (e.g., a phenolic moiety or a modified nucleotide) that can be chemically modified in the presence of and as a result of the catalytic activity of an enzyme to form a covalent chemical bond between (1) the modified polymerizing moiety and another substrate of the invention or (2) the modified polymerizing moiety and any other macromolecule present during the reaction, including (but not limited to) the enzyme itself. As used herein, "chemically modified" means subjected to any rearrangement of electron density, including addition or withdrawal of electrons.

Examples of polymerizing moieties that can be incorporated into a monomeric substrate for use in the invention include phenolic moieties and other moieties that can be accommodated by the catalytic center of the enzyme (e.g., a chemical structure having a suitable size, shape, and functional groups such as hydrogen bond donors and/or acceptors, hydrophobic and/or hydrophilic groups, aromatic rings and/or other functional groups as appropriate for creating hydrogen bonding, van der Waals interactions, ionic bonding, and/or pi stacking or other interactions between the substrate and the enzyme; such parameters can be identified using known or future methods including, but not limited to, computer-based molecular modeling and computational methods).

In certain embodiments, for example, the polymerizing moiety can be a phenolic moiety such as the following:

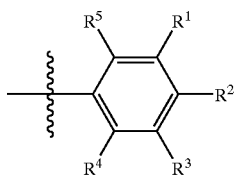

where $R^1$, $R^2$, $R^3$, $R^4$ and $R^5$, independently, can be H; $R^6$, wherein $R^6$ is $C_1$–$C_6$ unsubstituted alkyl; $NHC(O)R^6$; OH; or $NR^7R^8$, wherein $R^7$ and $R^8$ are H or $R^6$; provided that at least one of $R^1$, $R^2$, $R^3$, $R^4$ and $R^5$ is OH.

In some embodiments of the invention, $R^1$, $R^2$, $R^3$, $R^4$ or $R^5$ is at an ortho position relative to the OH substituent, and is either OH or $OCH_3$. In other embodiments, $R^1$, $R^2$, $R^3$, $R^4$ or $R^5$ is at a meta position relative to the OH substituent, and is either $NHC(O)R^6$ or $NR^7R^8$.

The enzyme employed to catalyze polymerization of the monomeric substrate can be, in some cases, covalently linked to a targeting moiety, and the targeting moiety can in turn bind noncovalently to a target molecule in an intercellular matrix or on the surface of a cell of the target tissue. In some embodiments, the enzyme is an oxidoreductase, e.g., a peroxidase such as lactoperoxidase and horseradish peroxidase, or a laccase. In alternative embodiments, the enzyme is a monophenol oxidase, monophenol monooxygenase, or catechol oxidase. An exemplary monophenol oxidase is tyrosinase.

Examples of useful targeting moieties are a primary antibody, a secondary antibody, a cell adhesion molecule, a cytokine, a cell surface receptor molecule, or a fragment thereof that recognizes a preselected binding partner. A primary antibody and a secondary antibody are preferred targeting moieties.

Compositions that include the compounds X-Y-Z described above, with or without a chelated metal atom or ion, are also considered to be an aspect of the invention.

Unless otherwise defined, all technical and scientific terms used herein have the same meaning as commonly understood by one of ordinary skill in the art to which this invention belongs. In case of conflict, the present application, including definitions, will control. All publications, patents and other references mentioned herein are incorporated by reference.

Although methods and materials similar or equivalent to those described herein can be used in the practice or testing of the present invention, the preferred methods and materials are described below. The materials, methods and examples are illustrative only and not intended to be limiting. Other features and advantages of the invention will be apparent from the detailed description and from the claims.

DETAILED DESCRIPTION OF THE INVENTION

Figure 1:
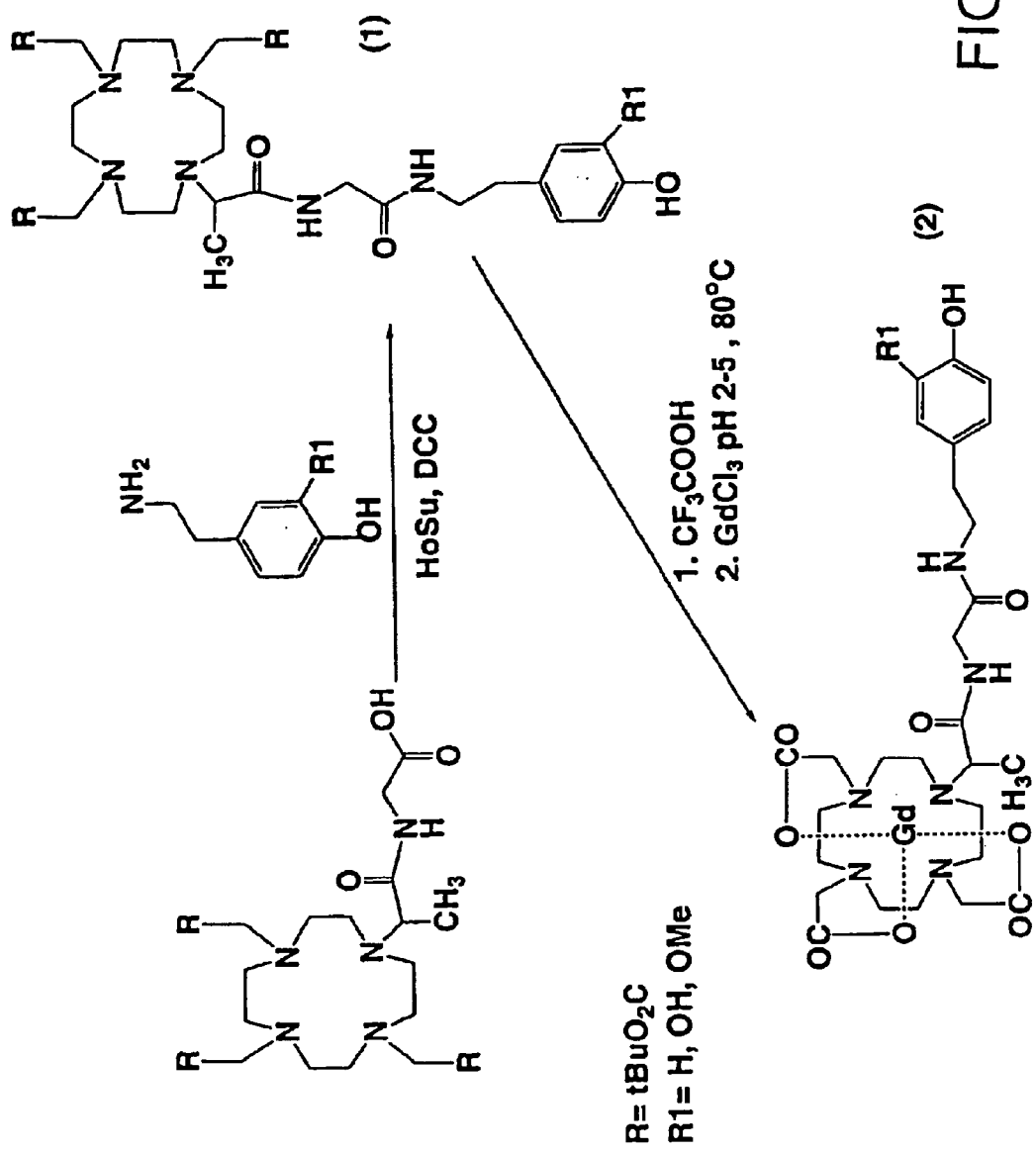
FIG. 1 is a synthetic pathway used for synthesis of an enzyme-responsive, paramagnetic monomeric substrate.

The invention features an MRI method that can be employed for non-invasive detection and imaging of a selected "marker" enzyme activity in tissues of an experimental animal or a human patient. The basis of the method is an enhancement of the effect on local proton relaxation rates (decrease in T1 and T2 relaxation times) exerted by a chelated (super)paramagnetic metal or metal oxide. This enhancement occurs when a monomeric substrate containing the chelated (super)paramagnetic metal or metal oxide undergoes polymerization catalyzed by the marker enzyme. The decreased relaxation times (increased relaxivity) associated with the polymerized product, relative to an equivalent amount of unpolymerized substrate, translates into an amplified MRI signal at the site of enzymatic activity.

While not intending to be bound by theory of the invention's mechanism, the inventors believe the increased relaxivity occurs because the polymerized product has an increased rotational correlation time ($\tau_r$), relative to that of the monomeric substrate.

Monomeric substrates used in method of the invention include four basic components: three structural moieties: (1) a chelating moiety, (2) a linker moiety, and (3) a polymerizing moiety. The fourth component is a bound paramagnetic or superparamagnetic metal atom or metal oxide. Each of the three structural moieties performs a separate function. The chelating moiety binds or chelates the paramagnetic or superparamagnetic metal atom or metal oxide. The phenolic moiety serves as an electron donor that participates in a free radical polymerization reaction catalyzed by the marker enzyme. The linker moiety provides a chemical bond between the chelating moiety and the polymerizing moiety, so that, when the polymerizing moiety undergoes polymerization, the chelating moiety, with its bound paramagnetic or superparamagnetic label, is polymerized concomitantly.

Various chelating moieties are known, and can be incorporated into a monomeric substrate useful in the invention, without undue experimentation. In addition, novel chelating moieties may be discovered in the future, and can be used in the invention. Preferably, the chelating moiety does not form a covalent bond with the paramagnetic or superparamagnetic metal or metal oxide. In preferred embodiments, the chelating moiety forms a thermodynamically and kinetically stable, non-covalent coordination complex or ionic complex with $Fe^{3+}$, $Gd^{3+}$, $Dy^{3+}$, $Eu^{3+}$, $Mn^{2+}$, or other useful metal or metal oxide.

Numerous chelating moieties suitable for incorporation into a monomeric substrate useful in the invention are known in the art. Examples of chelating moieties useful in the invention include:

1,4,7,10-tetraazacyclododecane-N,N',N",N"'-tetraacetic acid (DOTA);

1,4,7,10-tetraaza-cyclododecane-N,N',N"-triacetic acid;

1,4,7-tris(carboxymethyl)-10-(2'-hydroxypropyl)-1,4,7, 10-tetraazocyclodecane;

1,4,7-triazacyclonane-N,N',N"-triacetic acid;

1,4,8,11-tetraazacyclotetra-decane-N,N',N",N"'-tetraacetic acid;

diethylenetriamine-pentaacetic acid (DTPA);

triethylenetetraamine-hexaacetic acid;

ethylenediamine-tetraacetic acid (EDTA);

1,2-diaminocyclohexane-N,N,N',N'-tetraacetic acid;

N-(hydroxyethyl)ethylenediaminetriacetic acid;

nitrilotriacetic acid; and ethylene-bis(oxyethylene-nitrilo)tetraacetic acid;

The polymerizing moiety can be any biocompatible moiety that undergoes enzyme-dependent polymerization. Exemplary polymerizing moieties are a phenolic moiety, a modified nucleotide moiety, and a saccharide moiety. The marker enzyme and polymerizing moiety are selected for functional compatibility, i.e., the polymerizing moiety is recognized as a substrate by the marker enzyme.

As used herein, "phenolic moiety" means a moiety containing a phenolic ring. As used herein, a "phenolic ring" is a phenyl ring wherein at least one ring position is substituted with a hydroxyl (OH) group, and other ring positions are optionally substituted, provided that at least one ring position is unsubstituted. A phenolic ring can participate in a free radical polymerization reaction, under certain conditions.

A preferred phenolic moiety has the structure:

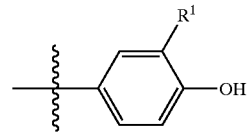

where $R^1$ is H, OH, or $OCH_3$. Numerous structural variations are permissible in the phenolic moiety. For example, in addition to the foregoing substitutions at one of the para positions, the other para position can be substituted as well, e.g., with H, OH, or $OCH_3$. When both para positions are substituted, the substituents can be the same or different. In another variation, an amino group or an amido group is substituted at a meta position on the phenolic ring. The effect(s) of the various substitutions possible on the phenolic ring can be predicted by one of skill in the art according to known principles of organic chemistry, based on the identities of the substituents and their relative positions on the ring. See, e.g., L. G. Wade, Jr., 1988, *Organic Chemistry*, Prentice-Hall, Inc., Englewood Cliffs, N.J. at 666–669. For example, an amino group at the meta position (relative to the hydroxyl group) is strongly activating, i.e., it makes the ring a better electron donor, and thus more reactive.

Based on well-known chemistry, it is predicted that in the present invention phenolic polymerization occurs when a phenolic free radical is generated by loss of an electron from a phenolic moiety. This occurs, for example, when each of two phenolic moieties donates one electron apiece in the reaction $H_2O_2 \rightarrow 2H_2O$ catalyzed by peroxidase. Two phenolic free radicals then react with each other to form a covalent linkage. The phenolic free radicals include several resonance forms in which the unpaired electron is present at different positions on the aromatic ring, as well as on the oxygen. This results in covalent coupling of the free radicals in various linkages, giving rise to a mixture of different polymerized products. Information concerning phenolic polymerization reactions and mechanisms of enzymes such as peroxidases, laccases, and tyrosinases is known in the art. See, e.g., Akkara et al., 1994, *Biomimetics* 2:331–339; Saunders et al., 1963, *Peroxidase*, Butterworth, Washington, D.C.; Akkara et al., 1991, *J. Polymer. Sci.* 29:1561–1574; Crestini et al., 2000, *Bioorg. Med. Chem.* 8:433–438; Guerra et al., 2000, *Enzyme Microb. Technol.* 26:315–323.

In practicing the present invention, knowledge of the exact structure of the polymerized product is not necessary. Without wishing to be bound by theory, it is believed that operation of the invention relates to the difference in atomic relaxivity between the monomeric substrate and the polymerized product, and does not depend on any particular structural arrangement of the subunit residues in the polymer. It is predicted that the polymerized product is a mixture of numerous, differently branching polymers.

Although the structural arrangement of the substrate residues in the polymerized product usually is not known, the range in the number of residues per polymer molecule can be determined in in vitro reactions, e.g., by size exclusion (gel filtration) chromatography. Such in vitro tests utilizing a particular substrate/enzyme combination can be employed to make useful predictions concerning the size of the polymers that will be formed in vivo. While the exact number of residues (or range of number of residues) per polymer is not critical, preferably the product mixture contains polymers whose length ranges up to 6, 7, 8, 10, 12, or 14 residues. In general, longer polymers are preferred. In preferred embodiments of the invention, the monomeric substrate is chosen so that: (1) neither the monomer nor the resulting polymers display significant toxicity in the amounts used for imaging, and (2) both the monomer and the resulting polymer are excreted or biologically degraded within hours to days after the monomer is administered to a patient.

Because its function is simply to connect the chelating moiety to the polymerizing moiety, there are no strict structural requirements for the linker moiety. Once incorporated in the monomeric substrate, the linker moiety need not participate in any chemical reaction or any particular binding interaction. Thus, the linker moiety can be chosen or designed primarily on factors such as convenience of synthesis, lack of steric hindrance, and biodegradation properties. A linker moiety containing one or more, e.g., 2–6, L-amino acids is preferred, because their carboxyl groups and amino groups are convenient for employment in synthesis of the monomeric substrate, the peptide bonds are biodegradable, and the products of polypeptide degradation are non-toxic. Amino acids such as glycine and alanine are preferred amino acids, because they do not have bulky or reactive side chains.

Although the invention is described here in terms of three distinct structural moieties in the monomeric substrate, those of skill in the art will recognize that there may not be a clearly defined dividing line between the chelating moiety and the linker moiety, and/or between the linker moiety and the polymerizing moiety. For example, in the monomeric substrate shown in FIG. 1, there are two methylene groups between the glycine residue in the linker moiety and the phenol ring in the polymerizing moiety. Whether those methylene groups are regarded as part of the linker moiety or part of the polymerizing moiety is essentially arbitrary. Moreover, those of skill in the art will recognize that the linker moiety does not necessarily represent a separate synthetic reagent. For example, in the monomeric substrate shown in FIG. 1, one glycine residue of the linker moiety derives from a portion of the glycylmethyl-DOTA tri-tBu ester reagent, and the other glycine residue derives from the tyramine or dopamine.

In the practice of this invention, in general, chelating moieties are interchangeable, phenolic moieties are interchangeable, and linkers are interchangeable. Thus, numerous different combinations of a chelating moiety, a phenolic moiety, and a linker are within the scope of the invention.

Each of the three structural moieties can be obtained commercially or synthesized according to conventional, organic chemical synthesis methods. Suitable covalent linkage of the three moieties can be carried out by one of skill in the art, employing conventional methods, without undue experimentation.

The marker enzyme can be any enzyme capable of catalyzing polymerization of a monomeric substrate containing a chelated (super)paramagnetic metal or metal oxide. This means that the marker enzyme is chosen for compatibility with a given monomeric substrate, or that the monomeric substrate is designed for compatibility with a given type of marker enzyme. For example, the marker enzyme can be a template-independent RNA or DNA polymerase, and the monomeric substrate can be a polymerizable nucleotide derivative. Alternatively, the marker enzyme can be an oxidoreductase, and the monomeric substrate can be an electron donor that undergoes polymerization upon oxidation by the oxidoreductase. Useful oxidoreductases include peroxidases such as hydrogen peroxide-oxidoreductase (E.C. 1.11.1.7), lactoperoxidase, and horseradish peroxidase.

When a peroxidase is used, methods of the invention include providing a suitable amount of hydrogen peroxide in the tissue to be imaged. The hydrogen peroxide can be supplied directly. Alternatively, it can be generated in situ, e.g., using glucose oxidase. If the hydrogen peroxide is enzymatically generated in situ, the generating enzyme can be administered directly (as a pre-formed enzyme) or can be expressed in the tissue from a suitable nucleic acid vector introduced into the tissue.

In principle, the marker enzyme can be an endogenous enzyme that occurs naturally in the tissue to be imaged. Typically, however, the marker enzyme is an exogenous enzyme linked to a targeting moiety. The targeting moiety causes selective accumulation of the marker enzyme in the tissue to be imaged. In general, the targeting moiety binds selectively to a molecule exposed in an extracellular matrix or on the surface of one or more cell types found in the tissue to be imaged. An example of a useful targeting moiety is an antibody directed against a cell surface protein or carbohydrate. Alternatively, the targeting moiety can be, for example, a cell adhesion molecule, a cytokine, a cell surface receptor molecule, or a fragment thereof that recognizes the intended binding partner. In some embodiments, the targeting moiety and marker enzyme are covalently linked to form a single molecule. For example, a peroxidase enzyme can be covalently coupled to a primary targeting antibody, using a conventional coupling reaction. In other embodiments, the marker enzyme is coupled to a secondary targeting moiety, e.g., a secondary antibody, which recognizes a primary targeting moiety, e.g., a primary antibody. This approach represents an adaptation of conventional "sandwich ELISA" techniques.

Enzyme-catalyzed reactions that result in polymeric products are not limited to oxidation-reduction reactions. Many enzymes (polymerases) catalyze the formation of chemical bonds between individual monomers.

As demonstrated by the Examples below, we have observed and characterized a paramagnetic relaxation phenomenon that can be utilized for magnetic resonance imaging signal amplification (MRAMP). The effect was observed using paramagnetic gadolinium held in a chelating moiety covalently bound to phenols that serve as electron donors during peroxidase-catalyzed hydrogen peroxide reduction. Instead of hydrogen peroxide itself, a hydrogen-peroxide system was also used including, for example, a mixture of glucose oxidase and glucose that produces hydrogen peroxide as a result of glucose oxidase-mediated oxidation of glucose. The monomers underwent rapid condensation into paramagnetic oligomers containing approximately eight residues of the monomeric substrate. Condensation resulted in a 2.5-fold to 3-fold increase of atomic relaxivity (R1/Gd). The observed relaxation effect could be explained by the increase of rotational correlation time $\tau_r$ of magnetic moieties comprising the product resulting in higher gadolinium atomic relaxivity (r1 or r2). Condensation of substrate monomers facilitated the detection of enzymatic activity by magnetic resonance imaging both spatially (qualitatively) and quantitatively. The feasibility of MRAMP in detecting nanomolar amounts of peroxidase was demonstrated in enzyme-linked immunoadsorbent assay format. MRAMP was further utilized in detecting E-selectin expression on the surface of IL-1β treated endothelial cells.

We assumed that the oxidoreductase (e.g., peroxidase (donor:hydrogen peroxide-oxidoreductase E.C. 1.11.1.7), or lactoperoxidase) would catalyze reduction of peroxide using a paramagnetic substrate (AH) as a donor of electrons (reaction 1). We also predicted that oxidized donors would then polymerize (oligomerize) into the larger paramagnetic polymers (reaction 2).

$$2AH + [E \cdot H_2O_2] \rightarrow 2[*A] + 2H_2O + E \quad \text{(reaction 1)}$$

$$n[*A] \rightarrow [A]n \quad \text{(reaction 2)}$$

We demonstrated that oxidoreductases oxidize tyramine- and dopamine-linked chelated gadolinium leading to formation of polymers. We observed a resultant 2.7-fold to 3.5-fold increase of atomic relaxivity and demonstrated that this relaxation phenomenon can be utilized to visual marker enzyme activity using MRI.

EXAMPLES

The invention is further illustrated by the following Examples. The Examples are provided for illustrative purposes only, and are not to be construed as limiting the scope or content of the invention in any way.

Example 1

Substrate Synthesis

Using glycylmethyl-DOTA, tri tBu ester, we linked a carboxyl group of glycine to the amino group of tyramine or dopamine (hydroxytyramine) by reacting equimolar amounts (0.25 mmol) in the presence of 1.1-fold molar excess of dicyclohexylcarbodiimide (FIG. 1) in 2 ml dimethylformamide (DMF) for 24 hours. The reaction mixture was filtered through glass fiber filter, dissolved in 100 ml chloroform and washed with water. The product was recovered by vacuum evaporation and treated with 50% trifluoroacetic acid (TFA) for 1 hour. Deprotected acid was washed with diethyl ether and dried by vacuum evaporation. Crude tyraminyl- or hydroxytyraminyl-glycylmethylDOTA was dissolved in a solution of equimolar amount of Gd citrate (pH 3.5), heated at 75° C. for 1 hour under argon and purified by using a Vydac C-18 HPLC column eluted by a gradient of acetonitrile in 0.1% TFA. The major peak at 280 nm was collected and dried. Analysis of the free acid by matrix-assisted laser desorption ionization/time-of-flight mass spectrometry (MALDI-TOF MS) gave a mass (m/z) of 594 (593 calculated). Analysis of purified gadolinium salt gave m/z 748 corresponding to the formation of monogadolinium salt.

Example 2

Cell Culture

Human umbilical vein endothelial cells (Endothelial Biology, Brigham and Women's Hospital, Boston, Mass.) were isolated using conventional techniques (see, e.g., Saba et al., *Series Haematologica* 6:456). Cells were plated on gelatin-covered plastic and cultured in 10%fetal bovine serum (FBS) in endothelial basal medium (EDM) (Clonetics) with endothelial growth supplements. Treatment of cells with human recombinant IL-1β (10 pg/ml) was performed at 37° C. for 4 hours. E-selectin expression on the surface of IL-1β treated cells has been proven by fluorescence microscopy using monoclonal anti-human E selectin antibody H18/7 (Vascular Research Dept. of Pathology, Brigham and Women's Hospital, Boston, Mass.), followed by anti-mouse-rhodamine conjugate (Pierce Chem. Co.).

Example 3

Peroxidase Catalysis and Imaging

Substrates I and II at concentrations of 10–50 μM were treated by peroxidase (0.1–100 nM) and an excess of hydrogen peroxide (3.5 mM) in 10 mM phosphate-buffered saline (PBS) or 0.05 M sodium phosphate pH 6.8. In some experiments, a peroxide-generating system (5 mM glucose, glucose oxidase and lactoperoxidase) was used. In inhibition studies, 2 mM Gd-free substrate, tyramine, dopamine, or methyldopamine were added as competitive inhibitors. The reaction was monitored by spectrophotometry at 400 nm and by NMR spectrometry (Minispec 120 Bruker). Magnetic resonance imaging was performed using a 1.5 T Signa GE system and surface or knee coils. Inversion-recovery pulse sequences (TE 11 ms/TR 1000 ms/TI 50–600 ms) were used for T1 measurements. Spin-echo sequence (TE 13 ms/TR 400 ms/2 NEX, Matrix 256×160) was optimal for magnetic resonance imaging of signal amplification. Magnetic resonance signal intensity was measured using region-of-interest approach and 16-bit TIFF images. Mean pixel values were compared using a Student t-test.

Example 4

MRI of Peroxidase Conjugate-Mediated Catalysis $Fab_2'$ fragment of H18/7 monoclonal anti-human E selectin antibody was prepared using pepsin digestion, and then purified. Labeling of $Fab_2'$-fragment with digoxigenin (DIG) hydroxysuccinimide ester (HSE) (Roche Molecular Diagnostics) was carried out according to the vendor's instructions. One ng to 1000 ng of DIG-labeled antibody was serially diluted with 0.01 M sodium carbonate (pH 9) in a 96-well plate (Nunc) and adsorbed at 37° C. overnight. Wells were washed with PBS containing 0.1% Tween 20 (PBST) blocked with BSA solution, and anti-DIG antibody-peroxidase conjugate (Roche, diluted 1:1000) was incubated in wells in PBS-B for 1 hour. Washed wells were filled with 200 μl of 0.4 mM substrate I or II and hydrogen peroxide (3.5 mM) and incubated for 30 min before imaging. Cells (2 million/sample) were treated sequentially with IL-1β, anti-E selectin DIG-labeled $Fab_2'$-fragment, and anti-DIG antibody-peroxidase. Cell suspensions were prepared in PBS and substrates were used as above. Cells were pelleted in Eppendorf tubes (0.5 ml), and then imaged as described above. Control samples were prepared by using no IL-1β treatment or in the absence of the first antibody in treated cells. Magnetic resonance signal intensity was quantified as described above and compared to that of aqueous Gd solutions.

Example 5
Enzyme-Mediated Oxidation and Relaxation Phenomena

Kinetics of oxidation of tyraminyl-DOTA(Gd), I, or hydroxytyraminyl-DOTA(Gd), II, in the presence of the excess of hydrogen peroxide was studied using spectrophotometry. The increase in absorbance at 400 nm in the case of both gadolinium-labeled substrates was rapid, indicating efficient oxidation of both substrates, and gave similar pseudo-first order kinetic constants: $k_1\text{app}=0.0125\ s^{-1}$ (I) and $0.013\ s^{-1}$ (II).

The measurements of relaxation time changes (T1 and T2) performed in parallel to spectrophotometry by using H1 NMR relaxometry at 20 MHz (0.47 T) and 60 MHz (1.5 T) showed a concomitant rapid decrease in relaxation times after the addition of the enzyme. By plotting relaxation data against the concentration of gadolinium, a raise of 1/T1 and 1/T2 of 2 fold (at 0.47 T) and 2.7 fold (1.5 T) in the case of substrate I, and 3.5 (at 0.47 T) in the case of substrate II has been measured (Table 1). Incubation of substrates in the presence of peroxide only did not result in any measurable change of gadolinium relaxivity. To find out whether the increase in relaxivity is a result of dissociation of gadolinium cation from a DOTA(Gd) complex, we treated Tyr-DOTA(Gd) or Dopamine-DOTA(Gd) with Chelex-100 resin and compared it to the control with no peroxidase added. No difference in T1 relaxation time of substrate solutions before and after the treatment was observed.

TABLE 1

| | Relaxivity enhancement | | | | | | | |
|---|---|---|---|---|---|---|---|---|
| | 0.47 T (20 MHz) | | | | 1.5 T (63 MHz) | | | |
| | r1 [mM$^{-1}$ s$^{-1}$] | | r2 [mM$^{-1}$ s$^{-1}$] | | r1 [mM$^{-1}$ s$^{-1}$] | | r2 [mM$^{-1}$ s$^{-1}$] | |
| Substrate | control | peroxidase | control | peroxidase | control | peroxidase | control | peroxidase |
| Tyraminyl-DOTA(Gd) | 3.30 | 7.10 | 3.60 | 8.00 | 4.5 | 10.1 | ND | ND |
| Hydroxytyraminyl-DOTA(Gd) | 3.75 | 11.50 | 4.10 | 12.46 | 5.2 | 14.1 | ND | ND |

Figure 2:
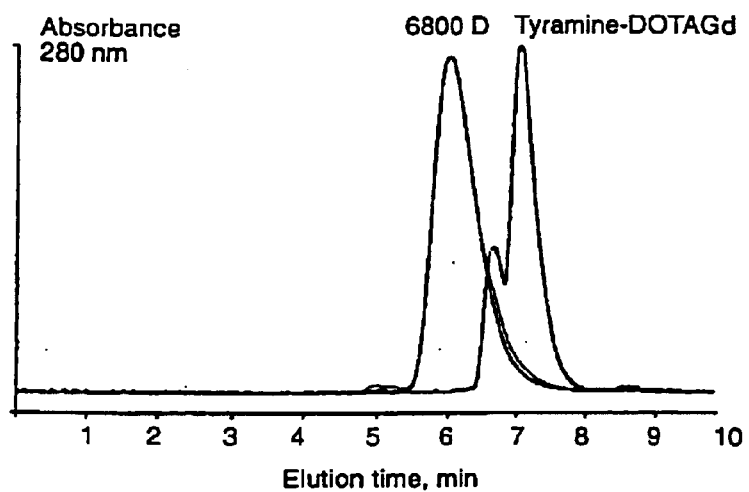
FIG. 2 is a chromatogram summarizing results of size exclusion analysis of polymerized reaction products.
Figure 6:
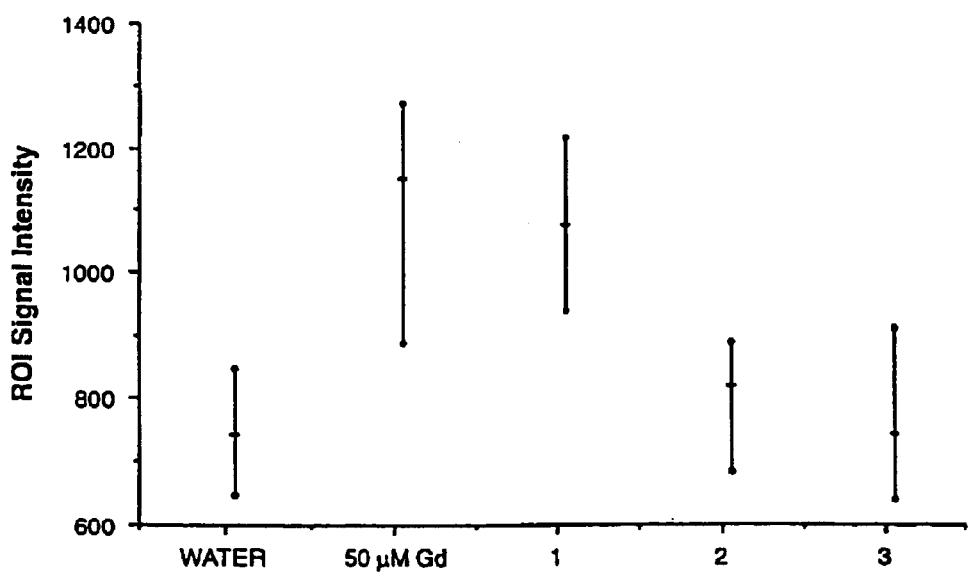
FIG. 6 is a graph showing confidence intervals of the corresponding pixel signal intensity distribution (SI) within region-of-interest (ROI) from photographs illustrating MRI of human umbilical vein endothelial cells (HUVEC) at 1.5 T. Image 1 shows a positive control solution of 50 µM Gd. Image 2 shows HUVEC cells treated with IL-1β, anti-E-selectin-DIG antibody and anti-DIG peroxidase conjugate followed by 400 µM Tyr-DOTA(Gd) (1 hour, room temperature). Image 3 shows control HUVEC cells with no IL-1β stimulation. Image 4 shows control HUVEC cells receiving IL-1β stimulation with no anti-E-selectin-DIG antibody.

To investigate whether the observed changes in atomic relaxivity were associated with the production of high molecular weight products, we incubated reaction mixture for different times ranging from 10 minutes to 1 hour, and analyzed reaction products using size-exclusion HPLC. We then compared elution profiles to that of a control substrate in the absence of peroxidase (FIG. 2). The comparison of elution profiles before and after peroxidase-mediated catalysis clearly pointed to the formation of a higher-molecular weight product with a hydrodynamic radius corresponding to a 6–7 kDa molecule (median=6.8 kDa). The measured mass suggests that the product was formed as a result of the condensation of eight oxidized substrate monomers. This was confirmed by MALDI-TOF analysis of reaction products.

To determine if the molecular mass of the condensation product depended on the initial concentration of the substrate, we varied the substrate concentration (10–60 μM) but observed no change in elution times of final condensation product. Finally, the addition of equimolar amount of non-labeled substrates as well as tyramine, dopamine, methyl-dopamine or tyrosine did not influence gadolinium relaxivity observed initially.

Example 6
Magnetic Resonance Imaging

Figure 3:
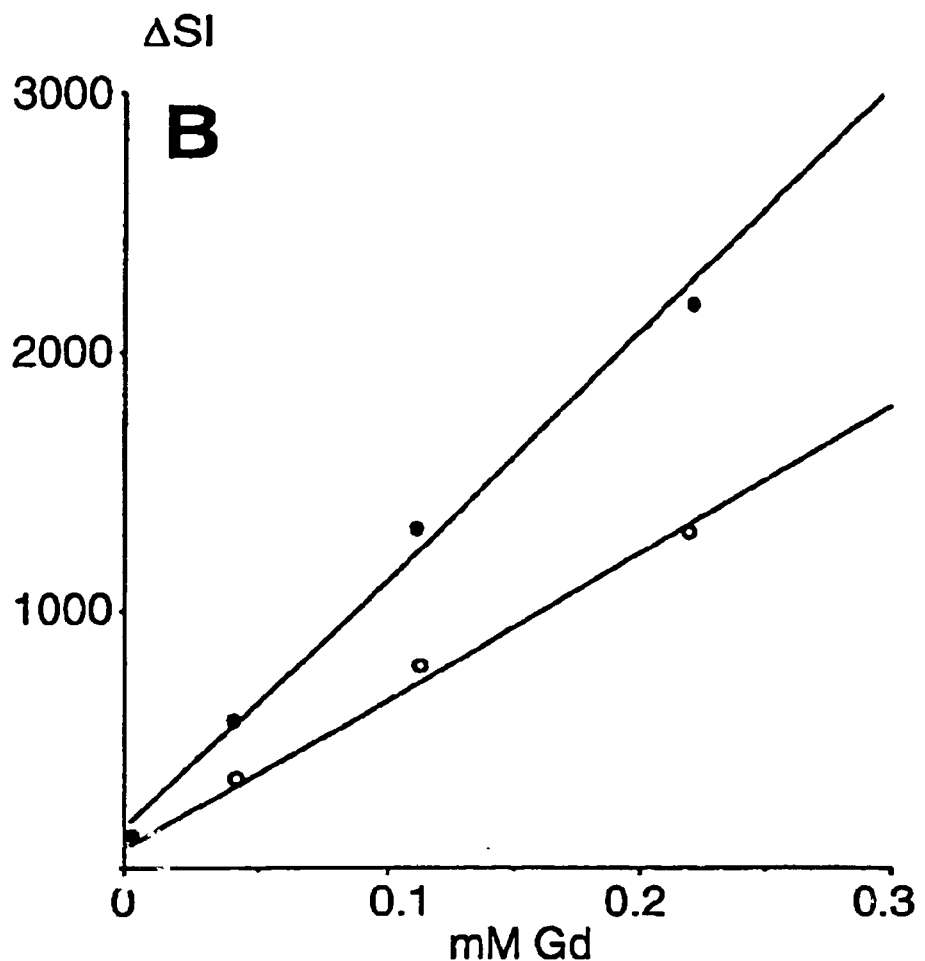
FIG. 3 is a graph summarizing data from MRI of tyramine-[1,4,7,10-tetraazacyclododecane-N,N',N'',N'''-tetraacetic acid, gadolinium salt] (tyramine-DOTA(Gd)) at various Gd concentrations before peroxidase treatment (open circles), and after peroxidase treatment (closed circles). These data show the dependence of signal intensity on gadolinium concentration and peroxidase-dependent polymerization.

The first MRI experiment was designed to test the feasibility of visualization of enzyme-mediated conversion of paramagnetic substrates. An array of tubes containing different dilutions of the substrates in the presence or in the absence of peroxidase and the substrate was used in this experiment. The enhancement of magnetic resonance signal in samples containing peroxidase and peroxide was clearly visible after applying spin-echo T1 weighted sequences. A median 1.6-fold enhancement of magnetic resonance signal was measured in a gadolinium concentration range of 0.05–0.4 mM after peroxidase treatment (FIG. 3). The signal intensity of reaction mixtures was brighter than aqueous gadolinium solution standards due to a higher atomic relaxivity.

Figure 4:
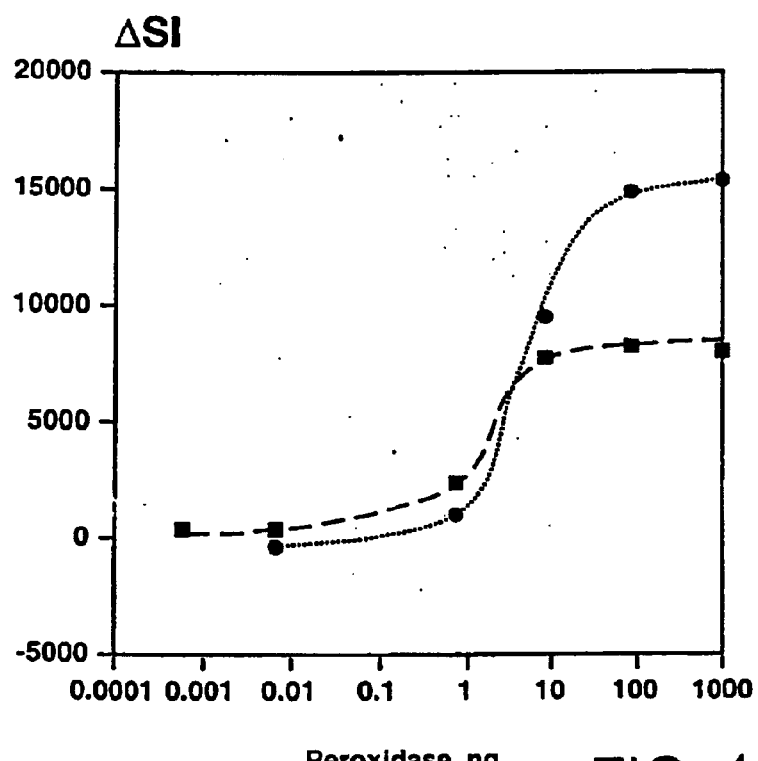
FIG. 4 is a graph showing magnetic resonance signal intensity enhancement as a function of peroxidase amount. Circles—Dopamine-DOTA(Gd); squares—Tyramine-DOTA(Gd). Imaging was performed at 1.5 T (Signa GE), 400 μM 1% fetal calf serum, 0.005% $H_2O_2$ detected using a spin-echo (SE) sequence.

To determine the sensitivity of the amplification method to the presence of peroxidase we varied the concentration of the enzyme in reaction mixtures containing 0.1–0.2 mM substrate I or II (FIG. 4). In both cases, amounts above 1 ng (e.g., 10 ng of peroxidase in the volume of 200 μl) produced clearly visible relaxation effects.

Figure 5:
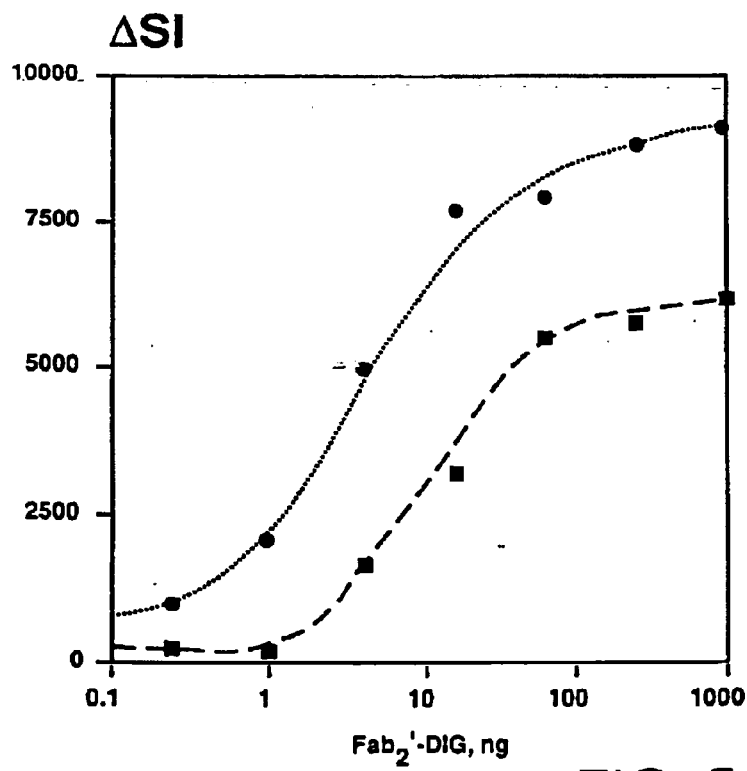
FIG. 5 is a graph showing magnetic resonance-ELISA signal intensity as a function of DIG-labeled antibody amount. Circles—Dopamine-DOTA(Gd); squares—Tyramine-DOTA(Gd). Imaging was performed at 1.5 T (Signa GE), 400 μM 1% fetal calf serum, 0.005% $H_2O_2$ detected using a SE sequence.

In the next series of experiments, we determined whether MRAMP could be utilized to detect a model ligand in an ELISA-like assay. Different amounts of the model protein (Fab2' fragment of monoclonal antibody) covalently labeled with digoxigenin were adsorbed on the surface of a 96-well plate and incubated in the presence of anti-digoxigenin-peroxidase conjugate. We found that the sensitivity of the MRAMP assay was optimized by using substrate II (1 ng antibody fragment detected at threshold) (FIG. 5). The sensitivity of standard ELISA assay was similar, also giving 1 ng as the threshold amount.

The latter experiment suggested feasibility of further MRI involving the detection of specific antigen expression on the surface of cells. We utilized a model system involving the highly specific expression of E selectin on the surface of human endothelial cells (HUVEC) as a response to interleukin-1β treatment. First, we demonstrated that E-selectin was indeed specifically expressed on the cell surface. The binding of anti-E-selectin Fab'2 was highly specific and detectable only in the case of IL-1β-treated cells as demonstrated by microscopy using fluorescent-labeled secondary antibody. The enzyme-mediated magnetic resonance signal enhancement was detected only in precipitates of cells that were treated with IL-1β followed by digoxigenin-labeled antibody and anti-dig-peroxidase. In controls, non-treated cells or IL-1β treated cells that were not incubated with anti-E-selectin antibody no enhancement over the background signal was seen. Specific magnetic resonance enhancement induced by the enzyme bound to the cell surface was typically 2-fold and was equivalent to the signal intensity of a 50 µM gadolinium phantom.

Example 7
Detection of Tyrosinase by Incorporation of Dopamine-DOTA(Gd) in Melanins Murine melanoma cells (B16 amelanotic melanoma, B16-F10, PC1, and PC1A) were plated in 10 cm dishes at 0.5 million cells/plate in 10% FCS, Dubecco's modified eagle medium (DMEM). At subconfluency (80%), medium was supplemented with 1 mM dopamine-DOTA, Gd salt, in the presence of 25 µM sodium ascorbate. At various time points, cells were harvested by trypsinization, washed by passing through a step of 40% Hypaque-1077 in Hank's solution, sedimented in 0.2 ml tubes, and changes in T1 and T2 relaxation times in cell precipitates were measured using 1.5 T Signa clinical imaging MR system using a 3 in surface coil.

Example 8
Synthesis of dUTP or UDP Substituted in 5-ring Position with Allylamino-DOTA(Gd)

Equimolar amounts (25 µmole) of GlyMeDOTA, tri-t-Bu ester and N-hydroxysuccinimide were treated with 1.1-molar excess of dicyclohexylcarbodiimide in 1 ml DMF for 4 hours under argon. Precipitate of dicyclohexylurea was removed by filtration and DMF removed in vacuum. 5-allylamino-2'-deoxyuridine-5'-triphosphate or 5-allylamino-2'-uridine-5'-diphosphate (25 µmol) was dissolved in a mixture of dioxane:water (1:1) and GlyMeDOTA, tri-tBu HSE ester was added. The mixture was incubated for 18 hours and treated with 70% TFA (by volume). After 3 hours at room temperature, the mixture was dried, in vacuo, dissolved in water, and extracted with chloroform. The aqueous phase was collected and mixed with 50 µmol Gd citrate in water. The reaction mixture was kept at 60° C. for two hours and purified using Nucleosil-4000 PEI7 HPLC column eluted with a 0.02–1 M gradient of ammonium acetate in water, pH 6. Fractions containing triphosphate (third major 260 nm positive peak) or diphosphate (second peak) were collected and lyophilized to constant weight.

Example 9
Nick-translation (NT) Labeling Using DNA Polymerase I—Preparation of Paramagnetic DNA Series of individual NT reactions were set in PCR tubes (0.2 ml) using the following reagents: 5 µg pCMV-Luc double-stranded plasmid DNA for labeling (concentration c>1 µg/µl) DOTA(Gd)-dUTP 1 nmol/µl; dNTPs (regular nucleotides): dATP, dCTP, dGTP, 0.5 mM each, dTTP 0.1 mM NT reaction buffer 10× (0.5 M Tris pH 8, 50 mM MgCl$_2$, 0.5 mg/ml BSA) DTT 0.1 M DNase (stock solution 3 mg/ml) diluted 1:2000 diluted in water. DNA-polymerase 5 U/µl (e.g., Boehringer Mannheim); EDTA (0.5 M, pH 8.0) A 50 µl reaction mixture was prepared on ice, using for one NT reaction 5 µl of DNA is used; 5 µl NT (10×); 5 µl DTT; 5 µl dNTP; 2 µl DOTA(Gd)-dUTP; 1 µl DNAse I; 1 µl DNA polymerase; water to 50 µl. The mixture was incubated 0.25–3 hours at 15° C., and then stopped with 2.5 µl EDTA (0.5 M, pH 8.0). A control mixture was prepared containing EDTA in the buffer. T1 changes were monitored using a 1.5 T Signa MR imaging system.

Example 10
Random-primer Paramagnetic Labeling of DNA Driven by Klenow Fragment of DNA Polymerase I Series of individual random-primer labeling reactions were set in PCR tubes (0.2 ml) using the following reagents: 10 µl DNA template (100 ng-1 µg); 10 µl random primer in 5× reaction buffer deionized water was added to increase the volume to 40 µl. The contents of these tubes were mixed and spun down. Tubes were heated in a boiling water bath for 5–10 minutes and cooled on ice. The following components were then added: 3 µl Non-radioactive Labeling Mix (0.5 mM); 2 µl 1 mM DOTA(Gd)-dUTP; and 1 µl Klenow fragment, exo-(5U/reaction).

Tubes were incubated for 0–20 hours at 37° C. Reactions were terminated using 1 µl 0.5M EDTA, pH 8.0. Time-dependent T1 changes were monitored using a1.5 T Signa MR imaging system.

Example 11
PCR Labeling Driven by Thermostable DNA Polymerase—Synthesis of Paramagnetic DNA Fragments A mixture was prepared using the following reagents: 1–2 ul DNA template (0.1–100 ng pCMV-GFP plasmid DNA); 2.5 µl of 10× PCR buffer (Roche); 1 µl primer(s) (20–50 µM forward and reversed GFP amplification primes from the stock); 0.25 µl d(ACG)TP (33.3 mM each); 0.7 µl 5 mM dTTP; 0.3–1.6 µl 1 mM DOTA(Gd)-dUTP; 0.2–0.4 µl Taq polymerase (5U/µl stock); and water to 25 µl. PCR was run using the following scheme: 1–2 cycles: 45 sec/94° C.-45 sec/15° C.-12 min/37° C.; 5 cycles: 40 sec/94° C.-45 sec/37° C.-4 min/66° C.; 24 cycles 40 sec/94° C.-45 sec/54° C.-4 min/66° C. Control reaction mixture was not subjected to PCR. The reaction was stopped at different phases of PCR and T1 changes were monitored using a 1.5 T Signa MR imaging system at room temperature.

Example 12
Reversed Transcription (Reaction is Driven by RNA-dependent DNA Polymerase). Synthesis of Paramagnetic DNA Using mRNA as a Template Total RNA was extracted from 9L-GFP cells using the RNA STAT-60 according standard protocol. The extracted RNA was re-precipitated in the presence of 0.2 M sodium chloride and 2 volumes of absolute ethanol before finally being dissolved in 20 µl of RNase-free sterile water. The following reagents were combined on ice: 8.0 µl 5× First Strand Buffer (Superscript II, Life Technologies); 1.5 µl anchored mRNA primer (5'-T20 100 pmol/µl); 3.0 µl 20 mM dNTP-dTTP (6.7 mM each of dATP, dCTP, dGTP); 3.0 µl 2 mM d TTP; 3.0 µl 2 mM DOTA(Gd)-dUTP; 4.0 µl 0.1 M DTT; 10 µg total RNA and water to 40 µl. Labeling reaction was incubated at 65° C. for 5 minutes, and then at 42° C. for 5 minutes. 200 U of reverse transcriptase (Superscript II, Life Technologies) was added and the mixture was incubated at 42° C. for 2 hours. T1 changes were monitored using a 1.5 T Signa MR imaging system at room temperature.

Example 13
Terminal Nucleotide Transferase (TdT)-mediated Synthesis of Paramagnetic DNA To a 50 µl reaction mixture containing 10µ of 5× reaction buffer was added: (1× reaction buffer: 20 mM Tris Acetate pH 7.9; 50 mM potassium acetate, 1 mM CoCl$_2$, 0.1 mM DTT, 0.01% Triton X-100, 10 µM oligo(dT)10) added dTTP (or dATP) to 0.2 mM and 3 µl 2 mM DOTA(Gd)-dUTP. Forty units of terminal deoxynucleotidyl transferase were added, and the reaction mixture was incubated for 30 minutes at 37° C. The reaction was stopped by heating to 70° C. with subsequent cooling to 40° C., and relaxivity was determined. Control reaction included heat-treated enzyme.

Example 14

Synthesis of Paramagnetic Polyribonucleotides Using Polymerization Catalyzed by Polynucleotide Phosphorylase (Polyribonucleotide Nucleotidyltransferase)

0.5 mM 5-(DOTA(Gd)allylamido-substituted uridine-5'-diphosphate in 50 mM Tris acetate; 50 mM NaCl; 6.7 mM UDP, 6.7 mM $MgCl_2$; and 0.1 mM $MnCl_2$ at pH 8.5 were reacted in the presence of polynucleotide phosphorylase from *E. coli* (40 PK units) at 37° C. for 30 min. The reaction was continuously monitored by measuring T1 changes every 5 minutes.

OTHER EMBODIMENTS

A number of embodiments of the invention have been described. Nevertheless, it will be understood that various modifications may be made without departing from the spirit and scope of the invention. For example, two or more chelating moieties can be incorporated into a single monomeric substrate molecule. Accordingly, other embodiments are within the scope of the following claims.

What is claimed is:

1. A method of detecting enzymatic activity, the method comprising:
   providing a monomeric substrate comprising the formula X-Y-Z, wherein X comprises a chelator moiety and a chelated paramagnetic or superparamagnetic metal atom or ion, Y comprises a linker moiety, and Z comprises a polymerizing moiety;
   contacting the substrate with a target tissue, wherein the substrate undergoes polymerization to form a paramagnetic or superparamagnetic polymer, the polymerization being catalyzed by an enzyme in an extracellular matrix or bound to the surfaces of cells of the target tissue; and
   detecting an increase in relaxivity for the polymer relative to an equivalent amount of unpolymerized substrate, thereby detecting enzymatic activity.

2. The method of claim 1, wherein the paramagnetic or superparamagnetic metal atom or ion is a transition metal atom or ion.

3. The method of claim 1, wherein the paramagnetic or superparamagnetic metal atom or ion is a lanthanide atom or ion.

4. The method of claim 1, wherein the polymerizing moiety comprises any chemical group that can be chemically modified as a result of the catalytic activity of the enzyme to form a covalent chemical bond between either (1) Z and another monomeric substrate or (2) Z and any other polymer or macromolecule present during the reaction, including the enzyme itself.

5. The method of claim 1, wherein Z is a moiety that can be accommodated by the catalytic center of the enzyme.

6. The method of claim 1, wherein X comprises a structure selected from the group consisting of:

1,4,7,10-tetraazacyclodo-decane-N,N',N'',N'''-tetraacetic acid;
   1,4,7,10-tetraaza-cyclododecane-N,N',N''-triacetic acid;
   1,4,7-tris(carboxymethyl)-10-(2'-hydroxypropyl)-1,4,7,10-tetraazocyclodecane;
   1,4,7-triazacyclonane-N,N',N''-triacetic acid;
   1,4,8,11-tetraazacyclotetra-decane-N,N',N'',N'''-tetraacetic acid;
   diethylenetriamine-pentaacetic acid (DTPA);
   ethylenedicysteine;
   bis(aminoethanethiol)carboxylic acid;
   triethylenetetraamine-hexaacetic acid;
   ethylenediamine-tetraacetic acid (EDTA);
   1,2-diaminocyclohexane-N,N,N',N'-tetraacetic acid;
   N-(hydroxy-ethyl)ethylenediaminetriacetic acid;
   nitrilotriacetic acid; and
   ethylene-bis(oxyethylene-nitrilo)tetraacetic acid.

7. The method of claim 1, wherein Z comprises the following structure:

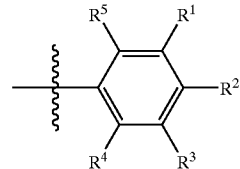

wherein:
   $R^1$, $R^2$, $R^3$, $R^4$ and $R^5$ are selected independently from the group consisting of H; $R^6$, wherein $R^6$ is $C_1$-$C_6$ unsubstituted alkyl; $NHC(O)R^6$; OH; or $NR^7R^8$, wherein $R^7$ and $R^8$ are H or $R^6$;
   provided that at least one of $R^1$, $R^2$, $R^3$, $R^4$ and $R^5$ is OH.

8. The method of claim 7, wherein $R^1$, $R^2$, $R^3$, $R^4$ or $R^5$ is at an ortho position relative to the OH substituent, and is selected from the group consisting of OH and $OCH_3$.

9. The method of claim 7, wherein $R^1$, $R^2$, $R^3$, $R^4$ or $R^5$ is at a meta position relative to the OH substituent, and is selected from the group consisting of $NHC(O)R^6$ and $NR^7R^8$.

10. The method of claim 1, wherein Y comprises a structure selected from the group consisting of: an amino acid, an oligopeptide comprising 2–6 amino acid residues, a nucleotide, an oligonucleotide comprising 2–6 nucleotide residues, a $C_3$-$C_{12}$ alkyl group, a polyethyleneimine, a saccharide, an oligosaccharide, a medium chain fatty acid, a polyamidoamine, a polyacrylic acid, and a polyalcohol.

11. The method of claim 1, wherein Y comprises an amino acid or oligopeptide containing 2–6 amino acid residues.

12. The method of claim 11, wherein the oligopeptide comprises a glycine residue.

13. The method of claim 1, wherein the monomeric substrate comprises the formula:

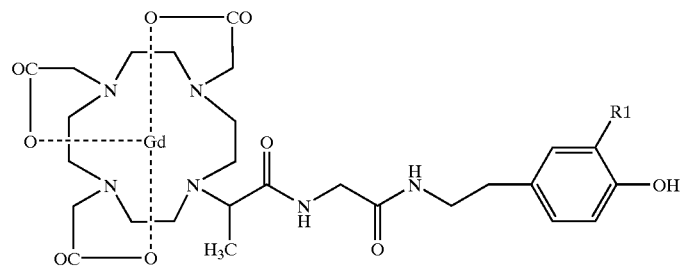

where R1 is selected from the group consisting of H, OH, and OCH$_3$.

14. The method of claim 1, wherein the enzyme is covalently linked to a targeting moiety, the targeting moiety being bound to a target molecule on the surface of a cell of the target tissue.

15. The method of claim 1, wherein the polymer is bound to one or more macromolecules in an extracellular matrix of the target tissue or to the surface of a cell of the target tissue.

16. The method of claim 15, wherein the macromolecules are selected from the group consisting of paramagnetic or superparamagnetic polymers, proteins, oligosaccharides, and polynucleotides present in the extracellular matrix or bound to the surface of a cell of the target tissue.

17. The method of claim 1, wherein the polymer is not bound to any other macromolecules.

18. The method of claim 1, wherein the enzyme is selected from the group consisting of an oxidoreductase, a monophenol oxidase, monophenol monooxygenase, and a catechol oxidase.

19. The method of claim 1, wherein the enzyme is selected from the group consisting of tyrosinase, tyrosinase-related protein, lipase, DNA polymerase, thermostable DNA polymerase, RNA polymerase, RNA-dependent DNA polymerase, reverse transcriptase, terminal nucleotide transferase, and polynucleotide phosphorylase.

20. The method of claim 18, wherein the enzyme is a monophenol oxidase or catechol oxidase.

21. The method of claim 18, wherein the oxidoreductase is selected from the group consisting of a peroxidase and a laccase.

22. The method of claim 18, wherein the oxidoreductase is a peroxidase is selected from the group consisting of lactoperoxidase and horseradish peroxidase.

23. The method of claim 14, wherein the targeting moiety is selected from the group consisting of a primary antibody, a secondary antibody, a cell adhesion molecule, a cytokine, a cell surface receptor molecule, or a fragment thereof that recognizes a preselected binding partner.

24. The method of claim 14, wherein the enzyme is a peroxidase and the targeting moiety is selected from the group consisting of a primary antibody and a secondary antibody.

25. The method of claim 1, wherein the target tissue comprises human or animal neovasculature.

26. The method of claim 1, wherein the target tissue comprises diseased or developmental human or animal tissue.

27. A method of detecting enzymatic activity using magnetic resonance imaging, the method comprising:
   providing a monomeric substrate polymerizable in the presence of an enzyme or as a result of an enzyme-catalyzed reaction, the substrate comprising the formula X-Y-Z, wherein X comprises a chelator moiety and a chelated paramagnetic or superparamagnetic metal atom or ion, Y comprises a linker moiety, and Z comprises a polymerizing moiety;
   contacting the substrate with a target tissue, wherein the substrate undergoes polymerization to form a paramagnetic or superparamagnetic polymer, the polymerization being catalyzed by an enzyme in an extracellular matrix or bound to the surfaces of cells of the target tissue; and
   detecting an increase in relaxivity for the polymer relative to an equivalent amount of unpolymerized substrate, thereby detecting enzymatic activity.

* * * * *